(12) United States Patent
Henson et al.

(10) Patent No.: US 9,735,241 B2
(45) Date of Patent: Aug. 15, 2017

(54) SEMICONDUCTOR DEVICE WITH A FIELD PLATE DOUBLE TRENCH HAVING A THICK BOTTOM DIELECTRIC

(71) Applicant: Infineon Technologies Americas Corp., El Segundo, CA (US)

(72) Inventors: Timothy D. Henson, Torrance, CA (US); Kapil Kelkar, Torrance, CA (US); Ljubo Radic, Torrance, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 20 days.

(21) Appl. No.: 14/267,726

(22) Filed: May 1, 2014

(65) Prior Publication Data

US 2014/0339651 A1    Nov. 20, 2014

Related U.S. Application Data

(60) Provisional application No. 61/824,235, filed on May 16, 2013.

(51) Int. Cl.
| | | |
|---|---|---|
| *H01L 29/40* | (2006.01) | |
| *H01L 29/78* | (2006.01) | |
| *H01L 29/66* | (2006.01) | |
| *H01L 21/765* | (2006.01) | |
| *H01L 21/308* | (2006.01) | |
| *H01L 29/423* | (2006.01) | |

(52) U.S. Cl.
CPC ........ *H01L 29/407* (2013.01); *H01L 21/3083* (2013.01); *H01L 21/765* (2013.01); *H01L 29/4236* (2013.01); *H01L 29/42368* (2013.01); *H01L 29/66666* (2013.01); *H01L 29/66674* (2013.01); *H01L 29/7801* (2013.01); *H01L 29/7827* (2013.01)

(58) Field of Classification Search
CPC .............. H01L 29/407; H01L 29/7801; H01L 29/66674
See application file for complete search history.

(56) References Cited

U.S. PATENT DOCUMENTS

| | | |
|---|---|---|
| 5,300,450 A | 4/1994 | Shen |
| 6,444,528 B1 | 9/2002 | Murphy |
| 7,012,005 B2 | 3/2006 | Lichtenberger |
| 8,101,484 B2 | 1/2012 | Bencuya |
| 8,143,123 B2 | 3/2012 | Grebs |
| 8,143,124 B2 | 3/2012 | Challa |
| 8,252,647 B2 | 8/2012 | Lee |

(Continued)

OTHER PUBLICATIONS

U.S. Appl. No. 61/824,235, filed May 16, 2013, Henson.
U.S. Appl. No. 14/267,760, filed May 1, 2014, Henson.
U.S. Appl. No. 14/267,787, filed May 1, 2014, Henson.

*Primary Examiner* — Michele Fan
(74) *Attorney, Agent, or Firm* — Murphy, Bilak & Homiller, PLLC

(57) ABSTRACT

Disclosed is a power device, such as power MOSFET, and method for fabricating same. The device includes an upper trench situated over a lower trench, where the upper trench is wider than the lower trench. The device further includes a trench dielectric inside the lower trench and on sidewalls of the upper trench. The device also includes an electrode situated within the trench dielectric. The trench dielectric of the device has a bottom thickness that is greater than a sidewall thickness.

4 Claims, 5 Drawing Sheets

(56) References Cited

U.S. PATENT DOCUMENTS

| | | | |
|---|---|---|---|
| 2005/0173758 A1* | 8/2005 | Peake | H01L 23/49562 257/330 |
| 2007/0108511 A1 | 5/2007 | Hirler | |
| 2007/0181975 A1 | 8/2007 | Koops | |
| 2009/0085107 A1* | 4/2009 | Hshieh | H01L 29/4236 257/331 |
| 2010/0244125 A1* | 9/2010 | Sonsky | H01L 29/407 257/330 |
| 2010/0264486 A1* | 10/2010 | Denison | H01L 29/42368 257/330 |
| 2011/0254088 A1 | 10/2011 | Darwish | |
| 2012/0309200 A1 | 12/2012 | Tay | |
| 2012/0319199 A1* | 12/2012 | Zeng | H01L 29/407 257/334 |
| 2013/0248987 A1 | 9/2013 | Okuhata | |

* cited by examiner

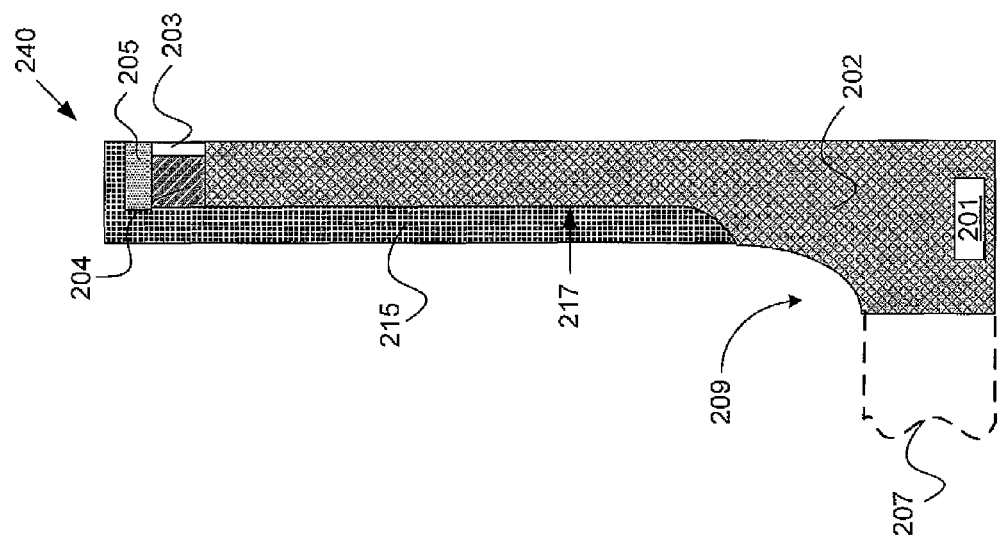
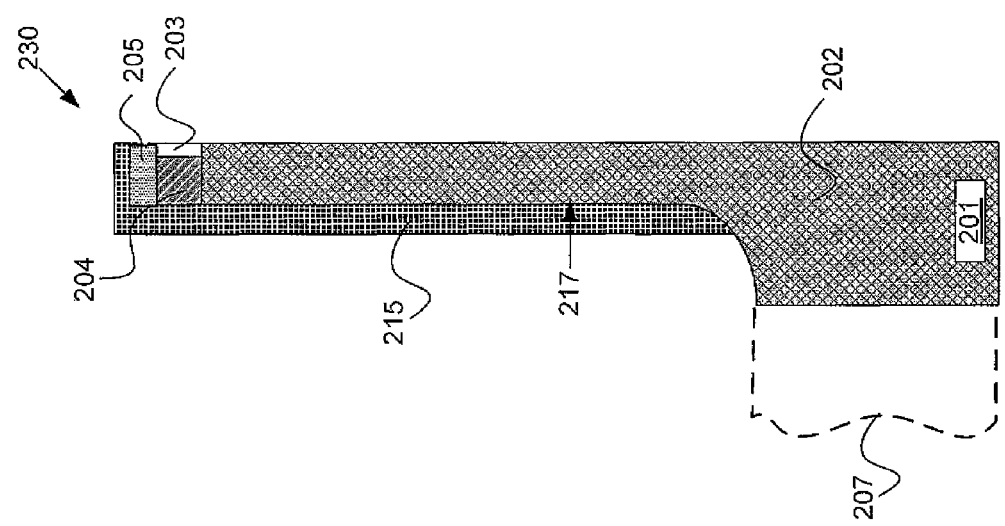
Fig. 2D
Fig. 2C

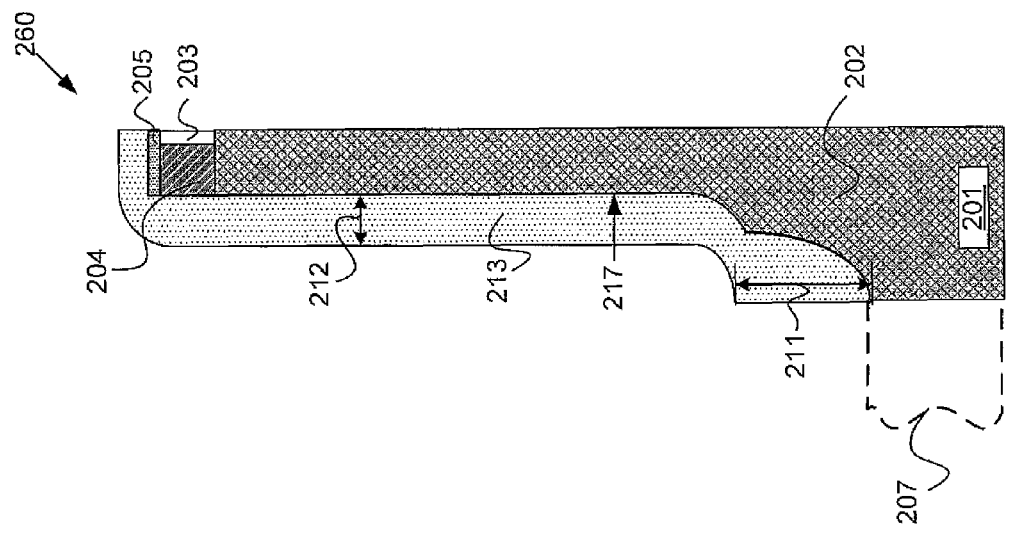
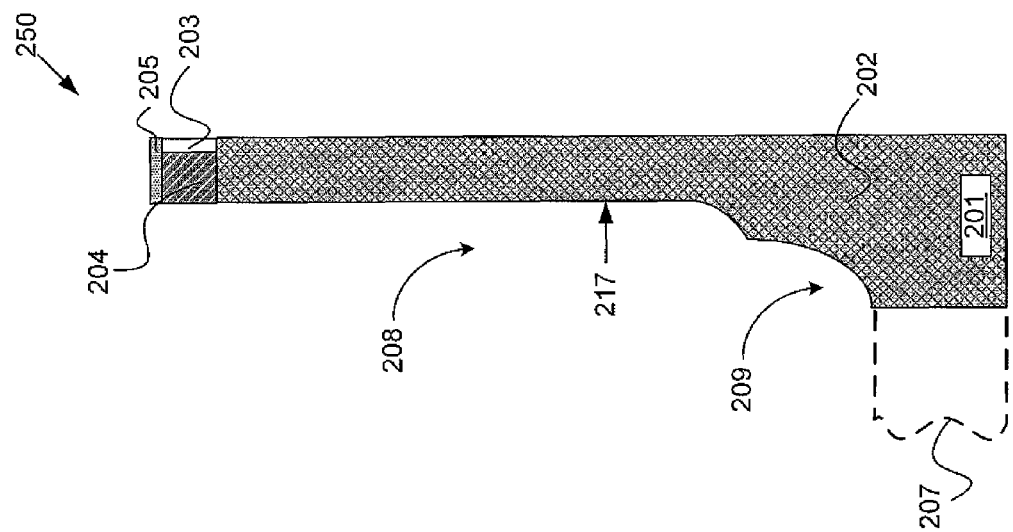

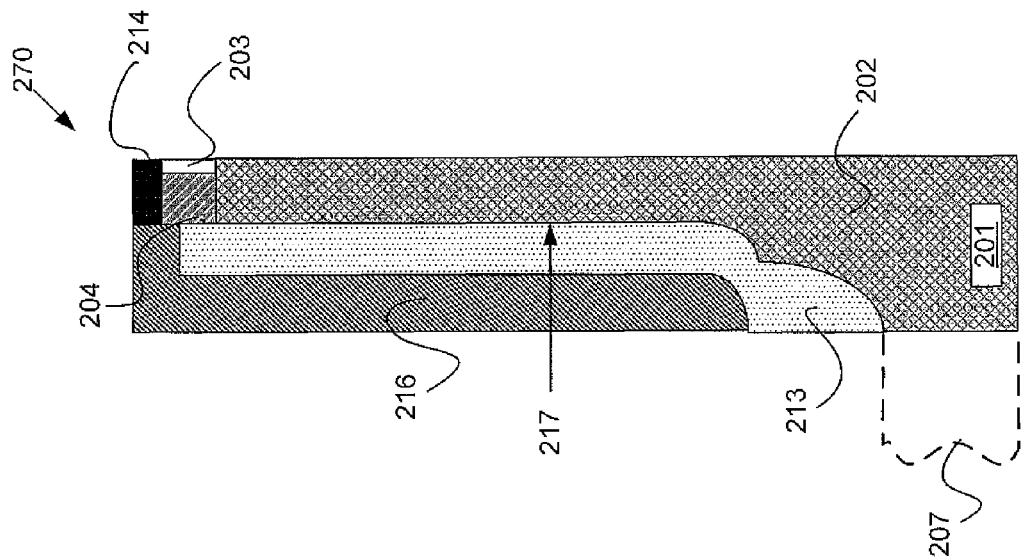

SEMICONDUCTOR DEVICE WITH A FIELD PLATE DOUBLE TRENCH HAVING A THICK BOTTOM DIELECTRIC

The present application claims the benefit of and priority to U.S. Provisional Patent Application Ser. No. 61/824,235, filed on May 16, 2013, and entitled "Semiconductor Trenches Having Thick Bottom Dielectrics Suitable for Field Plates." The disclosure of the above application is hereby incorporated fully by reference into the present application.

BACKGROUND

Power semiconductor devices, such as metal-oxide semiconductor field-effect transistors (MOSFET), are widely used in a variety of electronic devices and systems. Examples of these devices and systems include switches, DC to DC converters, and power supplies. In power devices, improving performance characteristics such as breakdown voltage, ON resistance ($R_{dson}$), and output capacitance are increasingly important. For example, it is desirable to lower $R_{dson}$, increase breakdown voltage, and decrease output capacitance, particularly using methods which do not add to the thermal budget for fabrication of semiconductor devices.

Conventional methods traditionally optimize one performance characteristic at the expense of another. For example, a semiconductor device may reduce $R_{dson}$ at the expense of lowering the breakdown voltage of the device. As such, there is a need for a structure and method for power MOSFETs that can overcome the deficiencies in the art.

SUMMARY

A semiconductor device with a field plate double trench having a thick bottom dielectric, substantially as shown in and/or described in connection with at least one of the figures, and as set forth more completely in the claims.

BRIEF DESCRIPTION OF THE DRAWINGS

FIG. 2C illustrates a cross-sectional view of an embodiment of the invention, corresponding to an intermediate step in the flowchart in FIG. 1.

FIG. 2D illustrates a cross-sectional view of an embodiment of the invention, corresponding to an intermediate step in the flowchart in FIG. 1.

FIG. 2E illustrates a cross-sectional view of an embodiment of the invention, corresponding to an intermediate step in the flowchart in FIG. 1.

FIG. 2F illustrates a cross-sectional view of an embodiment of the invention, corresponding to an intermediate step in the flowchart in FIG. 1.

FIG. 2G illustrates a cross-sectional view of an embodiment of the invention, corresponding to a final step in the flowchart in FIG. 1.

DETAILED DESCRIPTION

Figure 1:
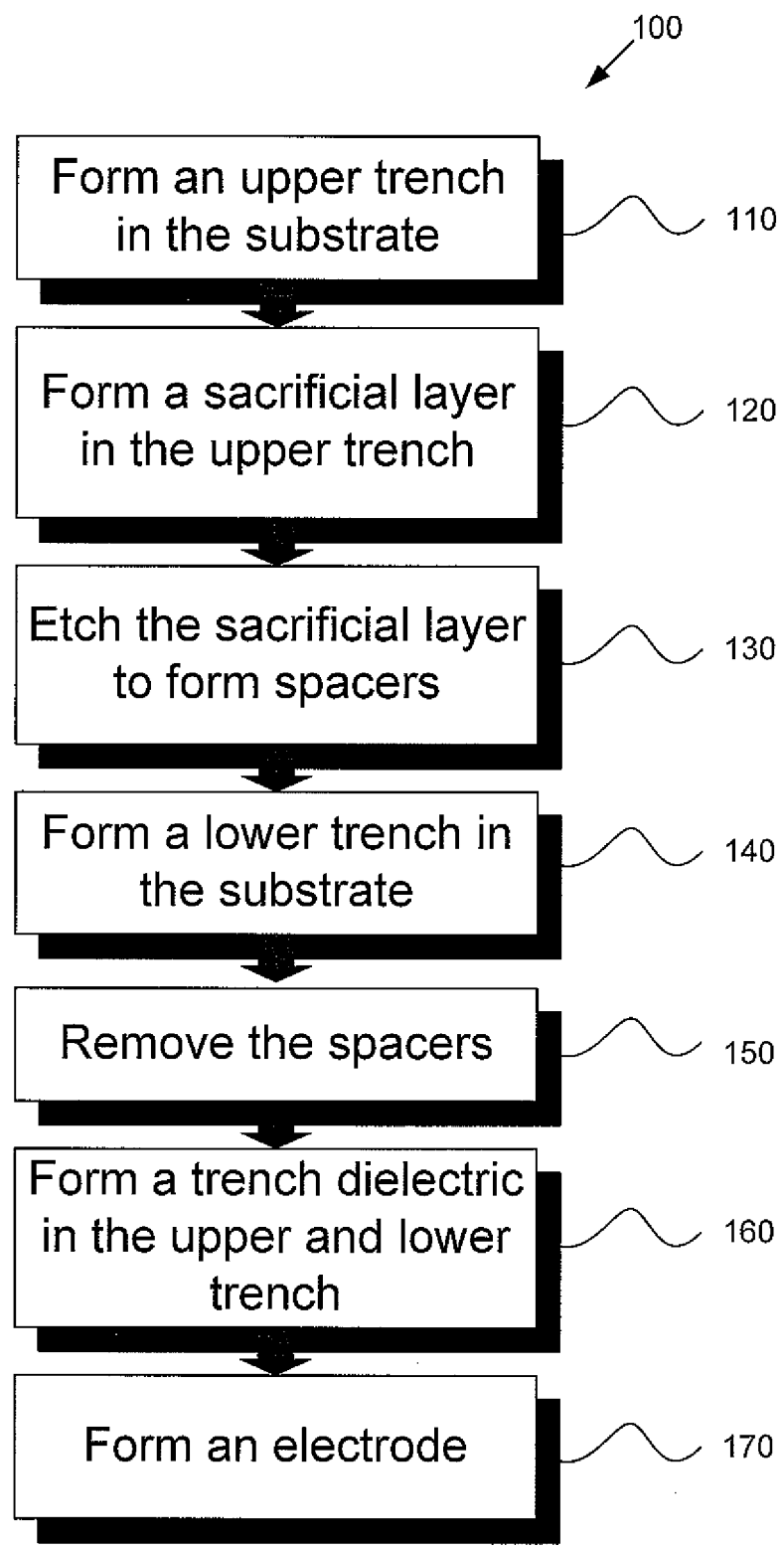
FIG. 1 shows a flowchart illustrating the steps taken to implement an embodiment of the present invention.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

FIG. 1 shows a flowchart illustrating a method for fabricating a power MOSFET according to an embodiment of the present invention. Certain details and features have been left out of flowchart 100 that are apparent to a person of ordinary skill in the art. For example, a step may consist of one or more substeps or may involve specialized equipment or materials, as known to a person of ordinary skill in the art. Steps 110 through 170 indicated in flowchart 100 are sufficient to describe one embodiment of the present invention; however, other embodiments of the invention may utilize steps different from those shown in flowchart 100.

Structures 210 through 270 in FIGS. 2A through 2G illustrate the result of performing steps 110 through 170 of flowchart 100, respectively. For example, structure 210 shows a cross-section of a semiconductor structure after processing step 110, structure 220 shows the cross-section of the structure after processing step 120, and so forth.

Figure 2B:
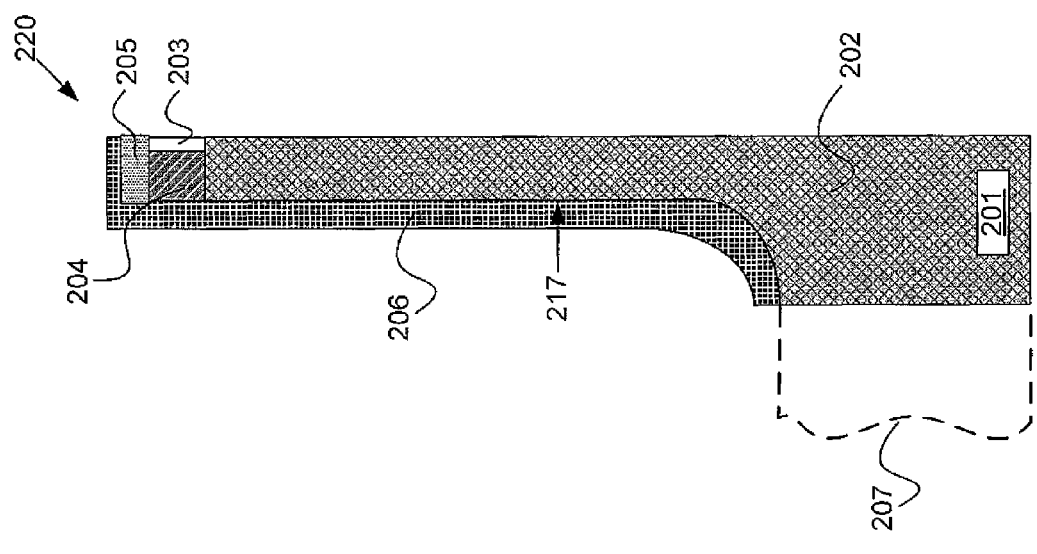
FIG. 2B illustrates a cross-sectional view of an embodiment of the invention, corresponding to an intermediate step in the flowchart in FIG. 1.
Figure 2A:
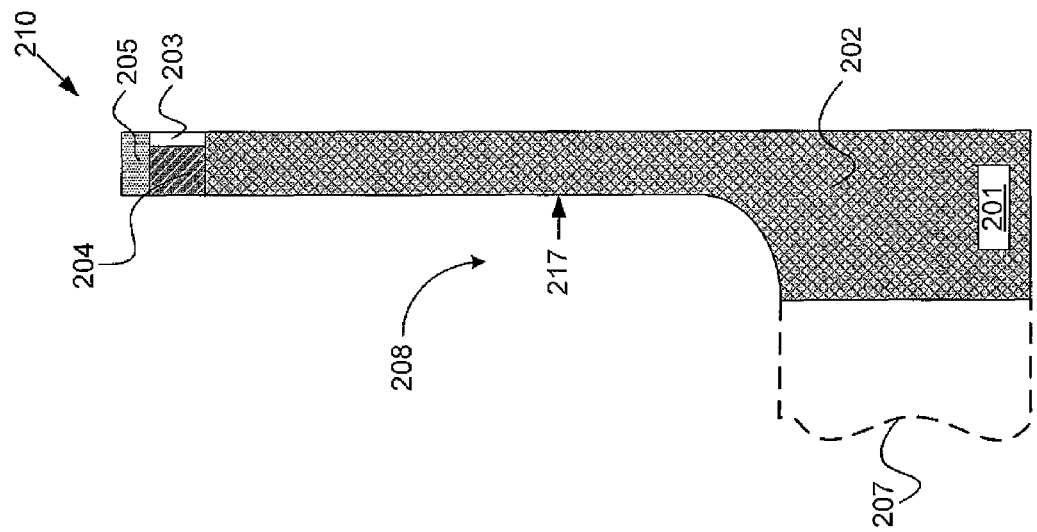
FIG. 2A illustrates a cross-sectional view of an embodiment of the invention, corresponding to an initial step in the flowchart in FIG. 1.

Referring to step 110 in FIG. 1 and structure 210 in FIG. 2A, structure 210 corresponds to a cross section of semiconductor substrate 201 after forming upper trench 208 in semiconductor substrate 201. Semiconductor substrate 201 can be, for example, an N type or a P type silicon substrate. Semiconductor substrate 201 includes drift region 202, body junction 204 and hard mask dielectric 205. Structure 210 further includes gate trench 203, which is only partially represented in FIG. 2A. Gate trench 203 may, for example, include a gate electrode and be lined by a gate dielectric. Although gate trench 203 and body junction 204 are shown in FIG. 2A, in some embodiments of the present invention gate trench 203 and body junction 204 may not have been formed before step 110 of flowchart 100. It is noted that dashed lines 207 in FIG. 2A, as well as in other Figures in the present application, indicate that semiconductor substrate 201 extends beyond the cross-sections specifically shown in the drawings of the present application.

Forming upper trench 208 can be done by, for example, depositing hard mask dielectric 205 over semiconductor substrate 201, body junction 204, and gate trench 203. Hard mask dielectric 205 may include, for example, tetraethyl orthosilicate (TEOS), silicon dioxide ($SiO_2$), or any other suitable material. Photoresist can be deposited and patterned over hard mask dielectric 205 and patterns can be formed in hard mask dielectric 205. Thus, hard mask dielectric 205 can be used as a hard mask to form upper trench 208 in semiconductor substrate 201. Structure 210 includes sidewall 217 of upper trench 208, however, as described above, structure 210 includes another sidewall similar to sidewall 217 on an opposite side of upper trench 208, which is not shown in the present drawings to simplify illustration of the present inventive concepts. In one embodiment, upper trench 208 can be formed so that the sidewalls, including sidewall 217, are substantially vertical, which can be, for example, between 80 to 90 degrees with respect to a bottom surface of semiconductor substrate 201.

Referring to step 120 in FIG. 1 and structure 220 in FIG. 2B, structure 220 shows structure 210 after forming sacrificial layer 206 in upper trench 208. Sacrificial layer 206 can include, for example, an oxide such as silicon dioxide. In the present embodiment, sacrificial layer 206 is isotropically deposited over hard mask dielectric 205 and into upper trench 208, without filling upper trench 208. Sacrificial layer 206 may be deposited to have a thickness of approximately 0.15 µm, as an example. In other embodiments, sacrificial layer 206 may completely fill upper trench 208, or alternatively, sacrificial layer 206 may include a thermally grown dielectric in upper trench 208.

Referring to step 130 in FIG. 1 and structure 230 in FIG. 2C, structure 230 shows structure 220 after etching sacrificial layer 206 to form spacer 215. Structure 230 includes spacer 215, however, as described above, structure 230 includes another spacer similar to spacer 215 on an opposite sidewall of upper trench 208, which is not shown in the present drawings to simplify illustration of the present inventive concepts. In the present embodiment, spacer 215 is formed by anisotropically etching sacrificial layer 206. However, in other embodiments, spacer 215 can be formed by other methods. Spacers, including spacer 215, are etched to leave an open space in upper trench 208 that is as wide as a desired width of lower trench 209, which is discussed further below.

Referring to step 140 in FIG. 1 and structure 240 in FIG. 2D, structure 240 shows structure 230 after forming lower trench 209 in semiconductor substrate 201. In the present embodiment, lower trench 209 is formed by anisotropically etching semiconductor substrate 201. However, in other embodiments, a different method may be used to form lower trench 209. The spacers, which include spacer 215, thereby determine the width of lower trench 209, which is less than the width of upper trench 208. Thus, if for example, spacer 215 were 0.15 µm thick, creating a combined thickness of 0.3 µm for both spacers (only one being shown in the drawings), then lower trench 209 would be 0.3 µm narrower than upper trench 208. Additionally, in the present embodiment, lower trench 209 is etched to a depth which allows for lower trench 209 to be filled completely by deposition of trench dielectric 213, which is discussed further below.

Referring to step 150 in FIG. 1 and structure 250 in FIG. 2E, structure 250 shows structure 240 after removing spacer 215. In the present embodiment, spacer 215 is removed by isotropically etching spacer 215. The isotropic etch used to remove spacer 215 would also at least partially etch hard mask dielectric 205 but would not completely etch hard mask dielectric 205, due to the thickness of hard mask dielectric 205 in the present embodiment. In some embodiments, the isotropic etch can fully remove hard mask dielectric 205, but as seen in FIGS. 2A, 2B, 2C, 2D, 2E, and 2F ("FIGS. 2A-2F"), hard mask dielectric 205 protects against etching semiconductor substrate 201, body junction 204, and gate trench 203.

Referring to step 160 of FIG. 1 and structure 260 in FIG. 2F, structure 260 shows structure 250 after forming trench dielectric 213 in upper trench 208 and lower trench 209. In the present embodiment, trench dielectric 213 is formed by depositing at least one of, for example, TEOS, or another suitable dielectric material, into upper trench 208 and lower trench 209. As a result of lower trench 209 being narrower than upper trench 208, trench dielectric 213 builds up in lower trench 209 to form bottom thickness 211 of trench dielectric. In some embodiments, bottom thickness may be between 0.5 µm to 1.0 µm, for example. Additionally, during deposition, trench dielectric 213 builds up on sidewall 217 of upper trench 208 to form sidewall thickness 212. Bottom thickness 211 of trench dielectric 213 is greater than sidewall thickness 212 of trench dielectric 213. In some embodiments, bottom thickness 211 can be, for example, at least 120% to 140% greater than sidewall thickness 212.

As shown in structure 260, trench dielectric 213 completely fills lower trench 209. In some embodiments, a width of lower trench 209 may be chosen to be, for example, one half the width of upper trench 208, such that forming trench dielectric 213 completely fills lower trench 209 upon deposition. In another embodiment, the width of lower trench 209 may be chosen to be less than two times sidewall thickness 212 to guarantee that trench dielectric 213 completely fills lower trench 209. However, in other embodiments, trench dielectric 213 may be recessed below lower trench 209 and thus only partially fill lower trench 209. In the present embodiment, sidewall thickness 212 of trench dielectric is substantially uniform from a bottom of sidewall 217 to a top of sidewall 217. However, in other embodiments, trench dielectric 213 on sidewall 217 may taper from the bottom of sidewall 217 to the top of sidewall 217, such that the thickness of trench dielectric 213 is less at the top of sidewall 217 than at the bottom.

Referring to step 170 of FIG. 1 and structure 270 in FIG. 2G, structure 270 shows structure 260 after forming electrode 216. In the present embodiment, electrode 216 is be formed by depositing electrode material into upper trench 208 and etching electrode material to form electrode 216 of desired size. In other embodiments, if trench dielectric 213 does not completely fill lower trench 209, then electrode material used to form electrode 216 may also be deposited into lower trench 209. In addition, structure 270 further includes source electrode 214 situated over body junction 204 and gate trench 203. In the present embodiment, electrode 216 is a field plate, however, electrode 216 may include another type of electrode in other embodiments. When electrode 216 is a field plate, upper trench 208 can be referred to as field plate trench. As discussed above, although body junction 204 and gate trench 203 were formed prior to upper trench 208 in the present embodiment, in other embodiments these features may be formed at another stage of the fabrication process such as, for example, after forming electrode 216. Furthermore, in other implementations, such as where a gate electrode has not been formed prior to step 170, an additional electrode or electrodes may also be formed in upper trench 208, such as, for example, a gate electrode.

A power device, such as a power MOSFET, using a double trench structure of the present invention offers several benefits and improved performance characteristics. For example, because bottom thickness 211 is greater than sidewall thickness 212, breakdown voltage of the power MOSFET is increased. In addition, due to the fact that the electric field is greatest between drift region 202 and electrode 216, the increased bottom thickness 211 reduces the electric field strength where it is most needed (i.e. at trench bottom) without requiring an increased thickness of trench dielectric 213 on sidewall 217. Further, because lower trench 209 is narrower than upper trench 208, a wider current path in semiconductor substrate 201 surrounding lower trench 209 is provided compared to a conventional single-trench structure having a bottom width similar to the width of upper trench 208. As a result of the wider current path, the $R_{dson}$ of the power MOSFET is reduced. Moreover, the double-trench structure of the present invention results in a reduction in output capacitance of the power MOSFET. It is noted that while the drawings of the present application have been discussed primarily in relation to embodiments of a power MOSFET, the present inventive concepts apply to other semiconductor devices as well.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A power semiconductor device, comprising:
    a gate trench formed in a semiconductor substrate, said gate trench including a gate electrode; and
    a field plate trench structure formed in said semiconductor substrate separate from said gate trench, said field plate trench structure comprising:
        an upper trench situated over a lower trench, said upper trench being wider than said lower trench;
        a trench dielectric situated inside said lower trench and on sidewalls of said upper trench;
        a field plate electrode situated within said trench dielectric;
    wherein a bottom thickness of said trench dielectric is greater than a sidewall thickness of said trench dielectric on said sidewalls of said upper trench;
    wherein a width of said lower trench is greater than one half a width of said upper trench;
    wherein said trench dielectric fills completely said lower trench; and
    wherein said upper trench of said field plate trench structure extends deeper into said semiconductor substrate than said gate trench.

2. The power semiconductor device of claim 1, wherein said bottom thickness is at least 120% greater than said sidewall thickness.

3. The power semiconductor device of claim 1, wherein said sidewall thickness tapers from a top to a bottom of said sidewalls.

4. The power semiconductor device of claim 1, wherein said trench dielectric comprises TEOS.

\* \* \* \* \*